US010466596B2

(12) United States Patent
Pierson et al.

(10) Patent No.: US 10,466,596 B2
(45) Date of Patent: Nov. 5, 2019

(54) SYSTEM AND METHOD FOR FIELD-BY-FIELD OVERLAY PROCESS CONTROL USING MEASURED AND ESTIMATED FIELD PARAMETERS

(71) Applicant: KLA-Tencor Corporation, Milpitas, CA (US)

(72) Inventors: Bill Pierson, Austin, TX (US); Ramkumar Karur-Shanmugam, Austin, TX (US); Chin-Chou Huang, Pleasanton, CA (US); Ady Levy, Sunnyvale, CA (US); John Charles Robinson, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 792 days.

(21) Appl. No.: 14/186,744

(22) Filed: Feb. 21, 2014

(65) Prior Publication Data
US 2015/0241790 A1 Aug. 27, 2015

(51) Int. Cl.
*G03F 7/20* (2006.01)
(52) U.S. Cl.
CPC .......... *G03F 7/70483* (2013.01); *G03F 7/705* (2013.01); *G03F 7/70625* (2013.01); *G03F 7/70633* (2013.01)
(58) Field of Classification Search
CPC ................................................ G03F 7/70483
See application file for complete search history.

(56) References Cited

U.S. PATENT DOCUMENTS

| | | | |
|---|---|---|---|
| 6,868,301 B1* | 3/2005 | Preil | G03F 9/7046 438/14 |
| 8,175,831 B2* | 5/2012 | Izikson | G05B 21/02 356/237.4 |
| 2007/0222979 A1 | 9/2007 | Van Der Laan et al. | |
| 2008/0316442 A1 | 12/2008 | Adel et al. | |

(Continued)

FOREIGN PATENT DOCUMENTS

JP 2009-277957 A 11/2009

OTHER PUBLICATIONS

Woong Jae Chung et al., Integrated production overlay field-by-field control for leading edge technology nodes, SPIE Proceedings, vol. 9050, Metrology, Inspection, and Process Control for Microlithography XXVIII, Apr. 2, 2014, 11 pages.

(Continued)

*Primary Examiner* — Jennifer E Simmons
(74) *Attorney, Agent, or Firm* — Suiter Swantz pc llo

(57) ABSTRACT

The present disclosure is directed to a method of determining at least one correctable for a process tool. In an embodiment, the method includes the steps of: measuring one or more parameter values at one or more measurement locations of each field of a selection of measured fields of a wafer; estimating one or more parameter values for one or more locations of each field of a selection of unmeasured fields of the wafer; and determining at least one correctable for a process tool based upon the one or more parameter values measured at the one or more measurement locations of each field of the selection of measured fields of the wafer and the one or more parameter values estimated for the one or more locations of each field of the selection of unmeasured fields of the wafer.

21 Claims, 9 Drawing Sheets

(56) References Cited

U.S. PATENT DOCUMENTS

| | | |
|---|---|---|
| 2009/0063378 A1 | 3/2009 | Izikson |
| 2011/0010000 A1* | 1/2011 | Mos .................. G03F 7/705 |
| | | 700/121 |
| 2011/0196646 A1* | 8/2011 | Mos .................. G03F 7/705 |
| | | 702/150 |
| 2011/0202298 A1 | 8/2011 | Izikson et al. |
| 2012/0029856 A1 | 2/2012 | Cohen et al. |
| 2012/0191236 A1* | 7/2012 | Ausschnitt ............ G03F 7/705 |
| | | 700/105 |
| 2013/0228683 A1* | 9/2013 | Boughorbel ......... G01N 23/225 |
| | | 250/307 |

OTHER PUBLICATIONS

PCT Search Report for International Application No. PCT/US2015/016881, dated Jun. 24, 2015, 3 pages.

\* cited by examiner

| FIELD SUBSET | MODEL-A | MODEL-B |
|---|---|---|
| REGION-702 | 100% | |
| REGION-704 | 20% | 80% |

SYSTEM AND METHOD FOR FIELD-BY-FIELD OVERLAY PROCESS CONTROL USING MEASURED AND ESTIMATED FIELD PARAMETERS

TECHNICAL FIELD

The present disclosure generally relates to the field of wafer processing and more particularly to methods of providing overlay control for a wafer processing tool.

BACKGROUND

Field-by-field correction, sometimes referred to herein as correction per exposure (CPE) methodology, was introduced in high volume manufacturing (HVM) production as an additional, complimentary, control loop to compensate for the systematic overlay wafer process signature from a process tool, such as a lithographic stepper or scanner. Run-to-run control loops using linear terms or high order control correctables are currently unable to provide the field-level resolution required to correct for process signatures. Accordingly, CPE control paths have been used to improve the overlay performance and has become well accepted in 2× nm HVM process nodes. Due to the need for a full wafer field sample plan, however, CPE correctables are typically not determined on a lot-by-lot basis. Instead, field-by-field control loops are maintained separate from the wafer-level resolution run-to-run control loops and are updated much less frequently (e.g. once every week or two), depending in part upon on wafer process stability.

In addition to the run-to-run and field-by-field control loops, a scanner baseline control loop is often recommended by process tool vendors to correct mechanical and optical drifts of the process tool. The baseline control loop periodically measures calibration wafers, such as non-product preventative maintenance (PM) wafers, to trace and correct the machine drift and to take care of fleet matching. Many of the process tools currently used in semiconductor fabrication rely on these three control paths: run-to-run, field-by-field, and scanner baseline. Accordingly, advance process control (APC) for process tools tends to be complex and costly. Moreover, as mentioned above, the current systems only allow for infrequent CPE updates, which are relatively time consuming in comparison to the standard APC run-to-run updates.

SUMMARY

In one aspect, this disclosure is directed to a method of providing standard APC run-to-run updates and field-by-field CPE updates via an integrated run-to-run, field-by-field control path. In some embodiments, for example, CPE correctables may be determined with the methodology discussed herein on a lot-by-lot basis. To allow for CPE control in a run-to-run setting, the method relies on a mixture of measured and estimated parameters. Accordingly, only a partial wafer sample plan is needed to generate the field-by-field CPE correctables. In general, the method includes the steps of: measuring one or more parameter values at one or more measurement locations of each field of a selection of measured fields of a wafer; estimating one or more parameter values for one or more locations of each field of a selection of unmeasured fields of the wafer; and determining at least one correctable for a process tool based upon the one or more parameter values measured at the one or more measurement locations of each field of the selection of measured fields of the wafer and the one or more parameter values estimated for the one or more locations of each field of the selection of unmeasured fields of the wafer.

In another aspect, this disclosure is directed to a system for determining at least one correctable for a process tool. In an embodiment, the system includes at least one metrology tool and at least one computing system. The computing system may be included in, communicatively coupled with, or separate from the metrology tool. The metrology tool is configured to measure one or more parameter values at one or more measurement locations of each field of a selection of measured fields of a wafer. The computing system is configured to receive the measurements directly or indirectly from the metrology tool and further configured to generate one or more parameter values for one or more locations of each field of a selection of unmeasured fields of the wafer based upon the one or more parameter values measured at the one or more measurement locations of each field of the selection of measured fields of the wafer. The computing system is further configured to determine at least one correctable for a process tool based upon the one or more parameter values measured at the one or more measurement locations of each field of the selection of measured fields of the wafer and the one or more parameter values generated for the one or more locations of each field of the selection of unmeasured fields of the wafer.

In yet another aspect, this disclosure is directed to a non-transitory carrier medium bearing an instruction set that is executable by at least one processor. The instruction set may include program instructions enabling the processor to: receive one or more parameter values measured at one or more measurement locations of each field of a selection of measured fields of a wafer; generate one or more parameter values for one or more locations of each field of a selection of unmeasured fields of the wafer based upon the one or more parameter values measured at the one or more measurement locations of each field of the selection of measured fields of the wafer; and determine at least one correctable for a process tool based upon the one or more parameter values measured at the one or more measurement locations of each field of the selection of measured fields of the wafer and the one or more parameter values generated for the one or more locations of each field of the selection of unmeasured fields of the wafer.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
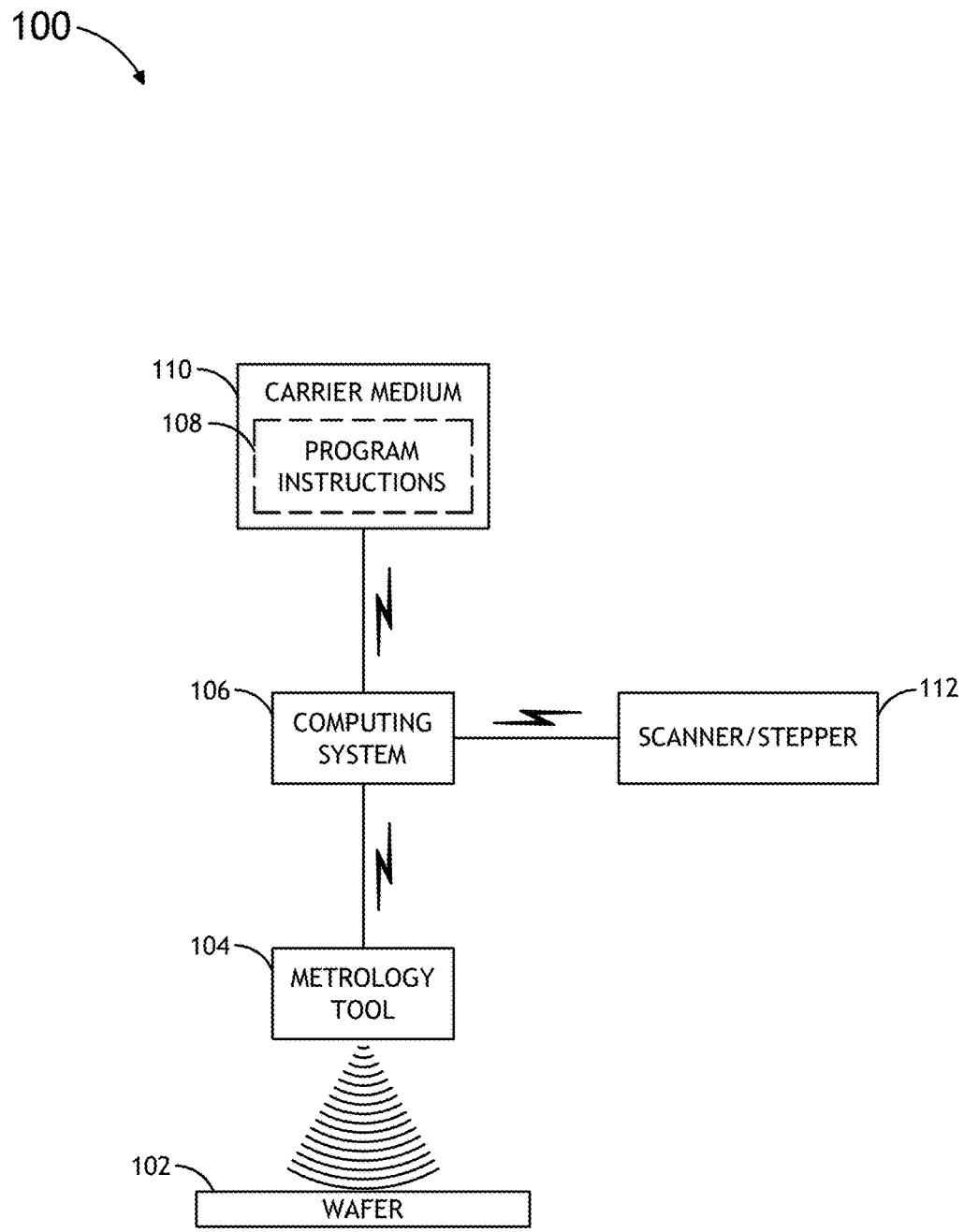
FIG. 1 is a block diagram illustrating a system for determining at least one correctable for a process tool, in accordance with an embodiment of this disclosure.

Reference will now be made in detail to the subject matter disclosed, which is illustrated in the accompanying drawings.

FIGS. 1 through 7B generally illustrate a system and method for determining correctables for a process tool with an integrated run-to-run, field-by-field control path. To determine field-by-field CPE correctables in a run-to-run setting, the method relies on a mixture of measured and estimated parameters. Accordingly, only a partial wafer sample plan is needed to generate the CPE correctables. CPE updates have been typically performed by fully sampling a wafer, sometimes consisting of 1000 or more measurement points, and generating field-by-field corrections for the full wafer. The current method provides the flexibility to measure fewer points across the wafer but still generate field-by-field corrections for the full wafer.

Conventionally, a metrology process, such as overlay metrology or critical dimension (CD) metrology, is carried out at fixed locations of a semiconductor wafer. These metrology measurements may then be used to calculate corrections, known as "correctables," used to correct an associated process tool used to perform a given process on the semiconductor wafer. These correctables include various optical and/or mechanical adjustments, such as optical drift correctables, mechanical drift correctables, overlay correctables, dose correctables, focus correctables, and the like. Correctables and methods of determining correctables are further discussed in US Patent Pub. Nos. 2011/0202298 and 2008/0316442, which are incorporated by reference in their entirety.

The current method relies on mathematical modeling (e.g. extrapolation and/or interpolation) of measured points to estimate corrections for non-measured fields. Sometimes throughout the disclosure, specific reference is made to an extrapolation or interpolation technique; however, unless the context requires specificity, those skilled in the art will appreciate the interchangeability of extrapolation, interpolation, combinations thereof, and/or any other mathematical modeling of measured field parameters to determine parameter values for unmeasured fields. As discussed below, various methods and options are available in metrology tools, such as the K-T ANALYZER, to achieve mathematical modeling. In some embodiments, the measured overlay from a sample plan can be decomposed into multiple subsets based on process signature. Each subset can then be modeled using a unique model that best characterizes that signature and then modeled to full wafer, which can then be decomposed into a field-by-field correction set. These processes, which are discussed in further detail below, may be carried out on-tool (i.e. on the metrology tool or the process tool) via an integrated computing system or by a communicatively coupled or detached computing system.

As used throughout the present disclosure, the term "wafer" generally refers to a substrate formed of a semiconductor or non-semiconductor material. For example, a semiconductor or non-semiconductor material may include, but is not limited to, monocrystalline silicon, gallium arsenide, or indium phosphide. A wafer may include one or more layers. For example, such layers may include, but are not limited to, a resist, a dielectric material, a conductive material, or a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g. group of 25 wafers) that are processed together. Each wafer in the lot includes a plurality of exposure fields from the lithography processing tools, such as steppers, scanners, and the like. Within each field may exist multiple die. A die is the functional unit that eventually becomes a single chip. On product wafers, overlay metrology marks are typically placed in the scribe-line area, for example, in the 4 corners of the field. This is a region that is typically free of circuitry around the perimeter of the exposure field (and outside the die). In some instances, overlay targets are placed in the streets, which are regions between the die but not at the perimeter of the field. It is fairly rare for overlay targets to be placed on product wafers within the prime die areas, as this area is critically needed for circuitry. Because of the spatial separation between the "scribe-line" metrology marks and the prime die circuitry, discrepancies occur between what is measured and what needs to be optimized on product wafers. As discussed above, various control loops are typically used to keep the process within specified tolerances. One or more layers formed on a wafer may be patterned or un-patterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

FIG. 1 illustrates a system 100 for determining one or more correctables for a process tool 112. In some embodiments, field-by-field correctables may be determined by the system 100 on a lot-by-lot or run-to-run basis. For example, measurements performed on a wafer 102 of a first lot of wafers may be used to provide one or more correctables for the process tool 112 during or prior to processing a second (subsequent) lot of wafers 102. Alternatively, the one or more correctables may be fed forward, that is, applied to the processing tool 112 during or prior to processing the first lot of wafers. In general, it will be apparent to those skilled in the art that the correctables may be provided for the process tool 112 via either one of a feed-forward or a feedback loop.

The system 100 may include a metrology tool 104, such as an overlay or CD metrology system, that is configured to measure one or more parameter values at one or more specified measurement locations of a selection of fields of the wafer 102. At least one computing system 106 may be configured to receive the one or more measured parameter values from the metrology tool 104. The computing system 106 may be further configured to generate one or more parameter values for one or more locations of a selection of unmeasured or non-measured fields of the wafer based upon at least one mathematical modeling with the measured parameter values. The computing system 106 may be further configured to determine one or more correctables for the process tool 112 based upon a set of parameters including the measured and estimated parameters (i.e. a full sample set for the fields of the wafer 102).

The computing system 106 may perform the various functions or operations described herein according to program instructions 108 executed by at least one processor of the computing system 106 from a communicatively coupled carrier medium 110. The program instructions 108 may further include an instruction set implementing the steps, functions, and/or operations described below with regard to method 200. In some embodiments, the computing system 106 is communicatively coupled or integrated with the metrology tool 104. As used herein, the term "communicatively coupled" may refer to a direct (wired) connection, a wireless connection, and/or a networked or switched connection. Accordingly, the computing system 106 may be further configured to control the sample set or measurements performed by the metrology tool 104. In some embodiments, the computing system 106 is additionally or alternatively communicatively coupled or integrated with the process tool 112. Accordingly, the computing system 106 may be further configured to control the process tool 112 in accordance with the determined correctables. Alternatively, the computing system 106 may be completely detached from the metrology tool 104 and/or the process tool 112 and configured to receive the measurements from the metrology tool 104 and/or provide the correctables for the process tool 112 via a portable carrier medium, such as a flash drive or an external hard drive. Moreover, the system 100 may include a plurality of communicatively coupled or detached computing systems 106 configured according to one or more of the foregoing embodiments. Those skilled in the art will appreciate that various modifications can be made to the arrangement and configuration of computing systems and/or any other controllers without departing from the scope of this disclosure.

Figure 2A:
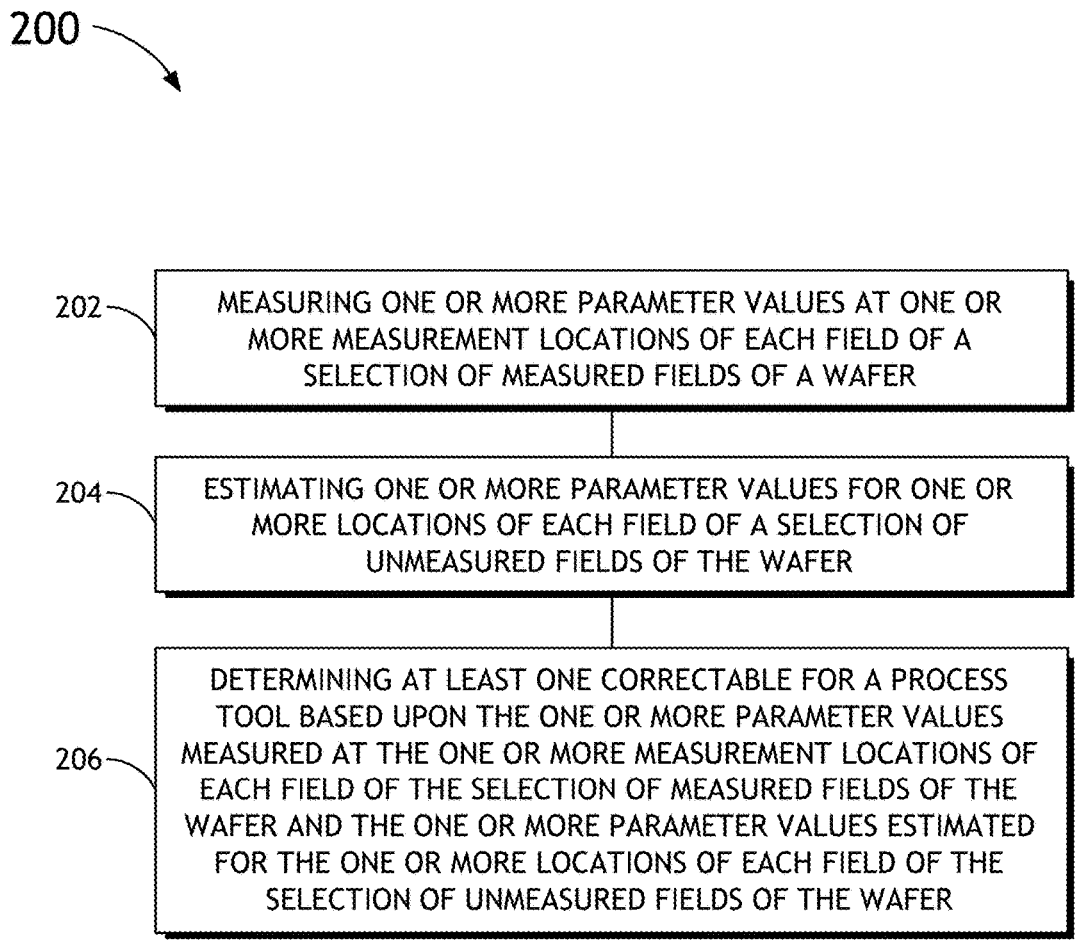
FIG. 2A is a flow diagram illustrating a method of determining at least one correctable for a process tool, in accordance with an embodiment of this disclosure.
Figure 2B:
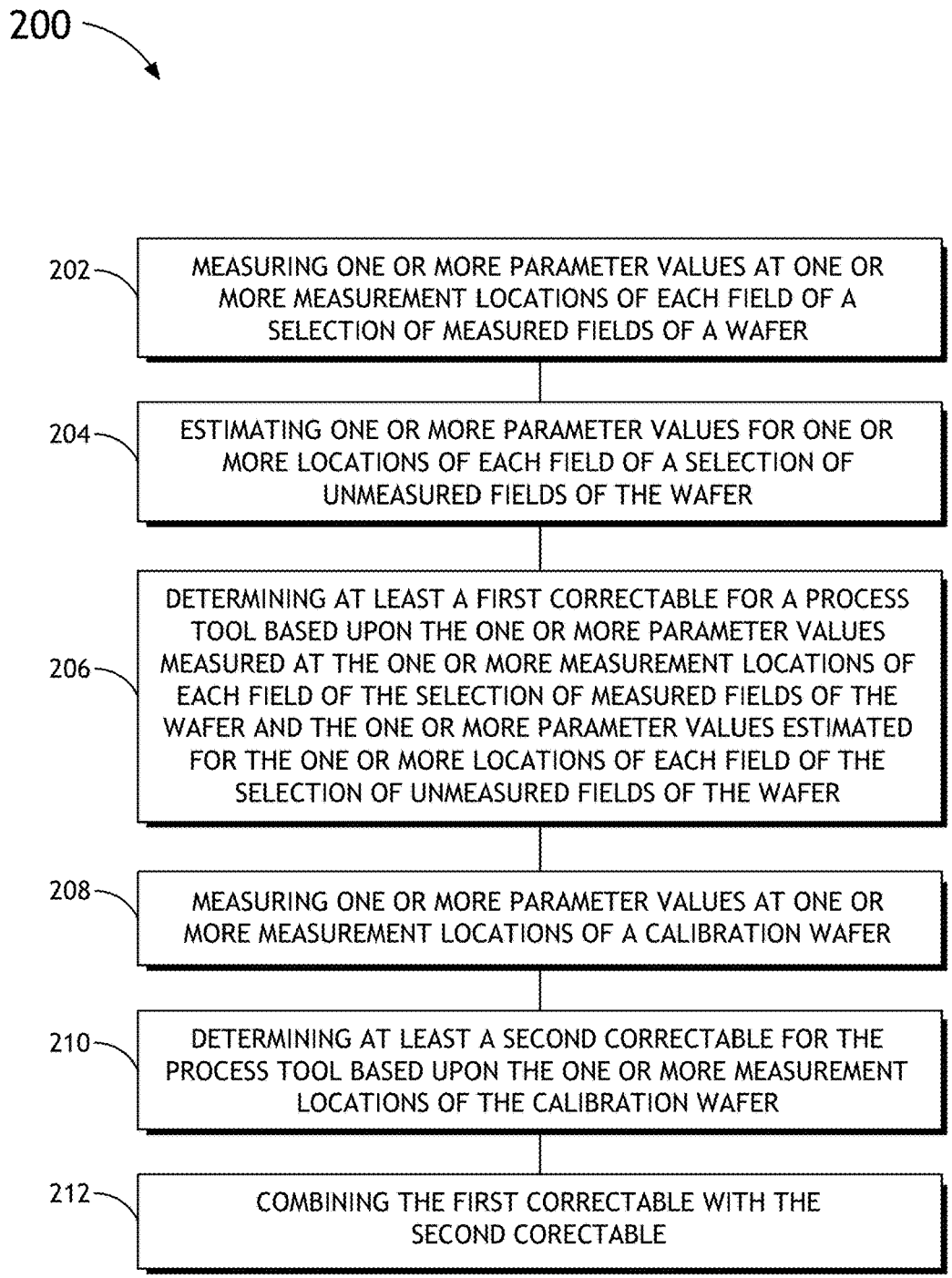
FIG. 2B is a flow diagram illustrating a method of determining at least one correctable for a process tool based upon measurements taken from a product wafer and measurements taken from a calibration wafer, in accordance with an embodiment of this disclosure.

FIGS. 2A and 2B are flow diagrams illustrating an embodiment of a method 200 of determining one or more correctables for a process tool. In some embodiments, the method 200 may be performed utilizing system 100 to determine the one or more correctables based upon partially sampling the fields of the wafer 102 and estimating unmeasured (i.e. non-sampled) fields via mathematical modeling. The method 200 may be manifested by an embodiment of system 100 or by any other system configured to perform one or more of the following steps. For example, the steps of method 200 may be implemented via one or more instruction sets embedded in the program instructions 108 stored on at least one carrier medium 110. For descriptive purposes, reference will be made to exemplary embodiments illustrated by FIGS. 3 through 7B; however, the method 200 is in no way restricted to the particular sample sets, measurement locations, models, and/or values illustrated in FIGS. 3 through 7B.

Figure 3:
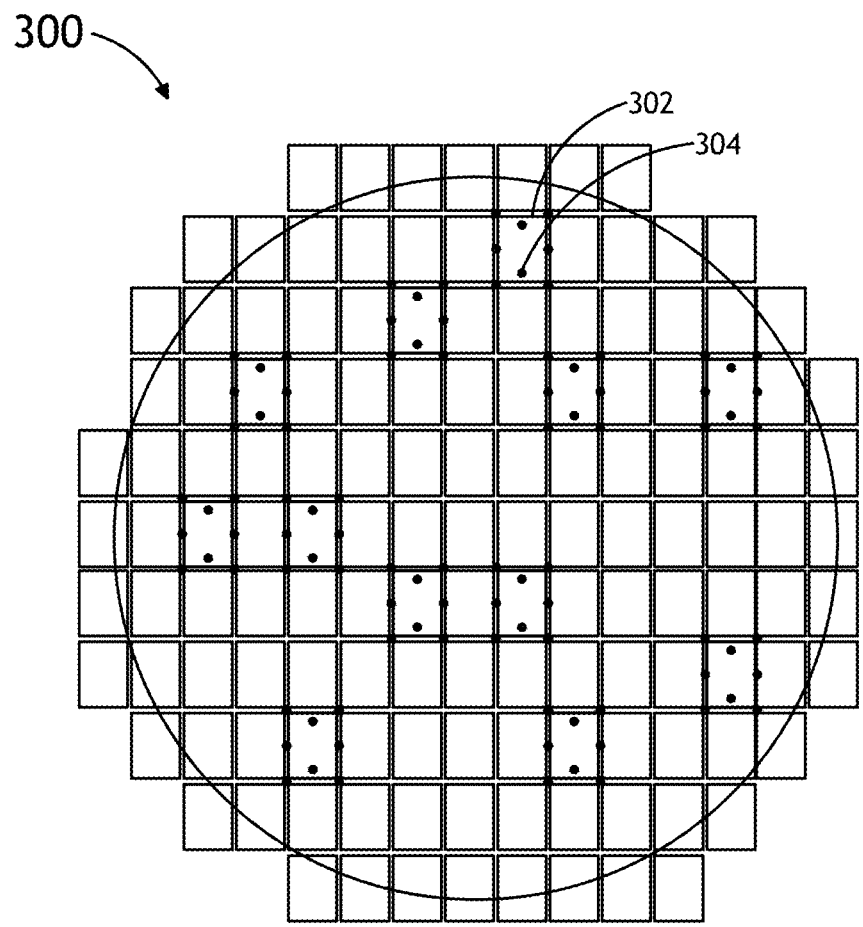
FIG. 3 illustrates a partial wafer sample plan, in accordance with an embodiment of this disclosure.

Looking now to FIG. 2A, the method 200 includes a step 202 of measuring one or more parameter values at one or more measurement locations of each field of a selection of measured fields of the wafer 102. The selection of measured fields may be based upon a predetermined mapping, a user selected mapping, or a randomly generated mapping. An exemplary wafer sample plan 300 is shown in FIG. 3. As can be seen, at each field 302 of the selection of measured fields (shown as fields including dots representative of sample points), the metrology tool 104 may perform measurements at one or more specified points 304. Accordingly, a measurement set is collected including sample data for the selection of measured fields 302.

In some embodiments, a relatively small number (e.g. 10-25%) of the wafer fields are measured. As later discussed, a sample set for the remaining selection of unmeasured fields can estimated based on the measured parameters. For example, a full sample set including parameter values for 1000 or more measurement locations, substantially covering all the fields of the wafer 102, may be estimated utilizing as few as one or two hundred sample points collected form the selection of measured fields. The full sample set (i.e. the set used for determining correctables) may include the measured parameter values for the sampled points of the wafer 102 and the model-based parameter values for the unmeasured fields. The full sample set may further include model-based parameter values for each of the fields (i.e. the measured fields and the unmeasured fields). For example, individually measured locations of a field may be modeled to generate at least one mathematical function that characterizes the field. Using this function, overlay may be estimated for all (measured and unmeasured) points within the field, and associated parameters (e.g. translation, rotation, magnification) may be fed back or fed forward to the process tool 112.

At step 204, the parameter values for the unmeasured fields are estimated based upon the measured parameter values of the sampled fields to allow for determination of field-by-field CPE correctables that can be directly or indirectly (e.g. via an APC fabrication host controller) provided to the process tool 112. A second sample set including parameter values for the unmeasured fields may be generated using one or more mathematical models based on the measured parameter values. In some embodiments, the second sample set includes only the model-based parameter values for the unmeasured fields. The first (measured) and second (estimated) sample sets are then combined to generate a full sample set. Alternatively, the model-based parameter values are integrated with the first sample set as they are determined. Regardless of the arrangement, the measured samples and the estimated samples or the field-by-field analysis terms derived therefrom are eventually combined to a single field-by-field analysis map, which is then used to determine one or more CPE correctables.

Figure 4:
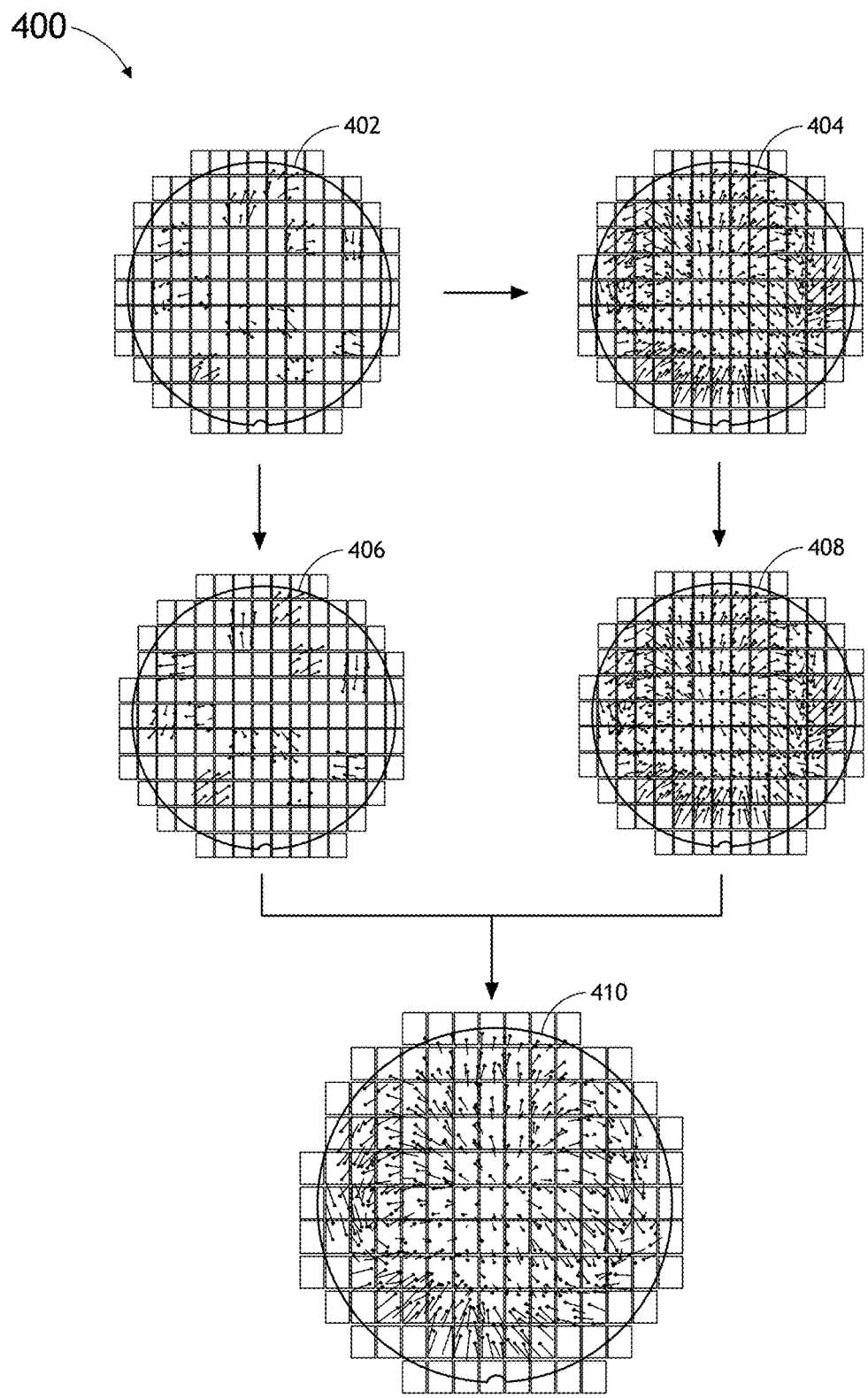
FIG. 4 illustrates a full wafer sample set generated from a partial wafer sample set via mathematical modeling, in accordance with an embodiment of this disclosure.

An exemplary embodiment of a mathematical modeling 400 (e.g. polynomial extrapolation) is shown in FIG. 4. The modeling 400 utilizes a first (measured) sample set 402 including parameter values for the selection of measured wafer fields and generates a second (estimated) sample set 404 for the non-measured wafer fields based upon a selected mathematical model. In some embodiments, the selected mathematical model is chosen from a plurality of available models based upon its ability to characterize and correct process signature. In some embodiments, it is advantageous to use a plurality of models as the process signature may vary from region to region on the wafer 102. Further, as will be discussed below, two or more weighted models may be used to estimate parameter values for each field of a group of fields falling within the same region of the wafer 102. Field-by-field analysis maps 406 and 408 may be generated based upon the measured sample set 402 and the estimated sample set 404, respectively. These analysis maps 406 and 408 may then be combined into a full (master) field-by-field analysis set 410 for the wafer 102.

Figure 5A:
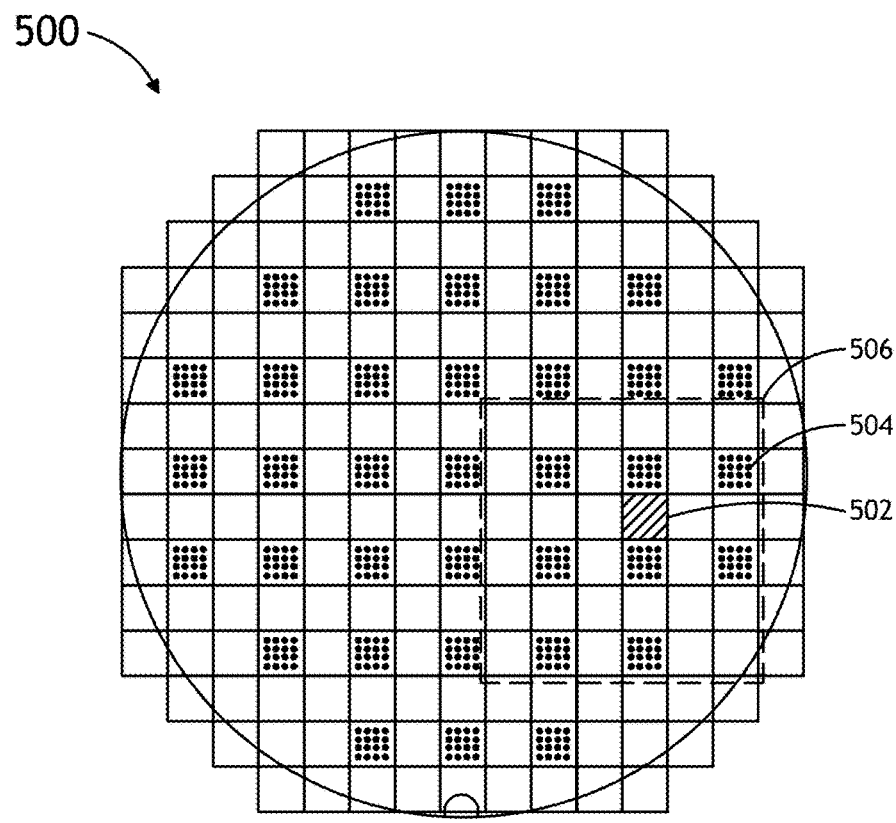
FIG. 5A illustrates a partial wafer sample set for generating one or more sample points for one or more unmeasured fields via proximity-based mathematical modeling, in accordance with an embodiment of this disclosure.

The mathematical modeling 400 shown in FIG. 4 is but one example of the modeling that can performed to estimate parameter values for field-by-field mapping of unmeasured wafer fields. For example, a zonal modeling technique (e.g. zonal extrapolation) is illustrated in FIG. 5A, where the parameter values for one or more fields of a sample set 500 are generated using data from measured fields within certain proximity of an unmeasured field 502. For example, parameter values form the unmeasured field 502 may be extrapolated from the measured parameter values of sampled fields 504 located within a specified zone 506 of the wafer 102 that includes the unmeasured field 502. Various wafer regions (e.g. edges) may be affected by localized process variations, resulting in bad overlay. These localized variations are sometimes difficult to model utilizing linear or polynomial modeling and need to be treated differently. Accordingly, zonal modeling may assist in generation of field-by-field correction terms that are better tailored to the localized process variations in certain regions of the wafer 102.

Figure 5B:
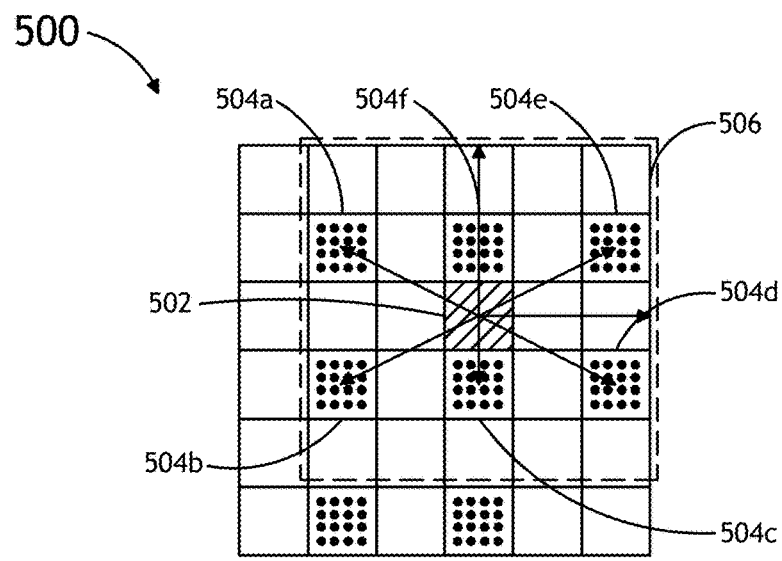
FIG. 5B illustrates a partial wafer sample set for generating one or more sample points for one or more unmeasured fields via proximity-based mathematical modeling, in accordance with an embodiment of this disclosure.
Figure 5C:
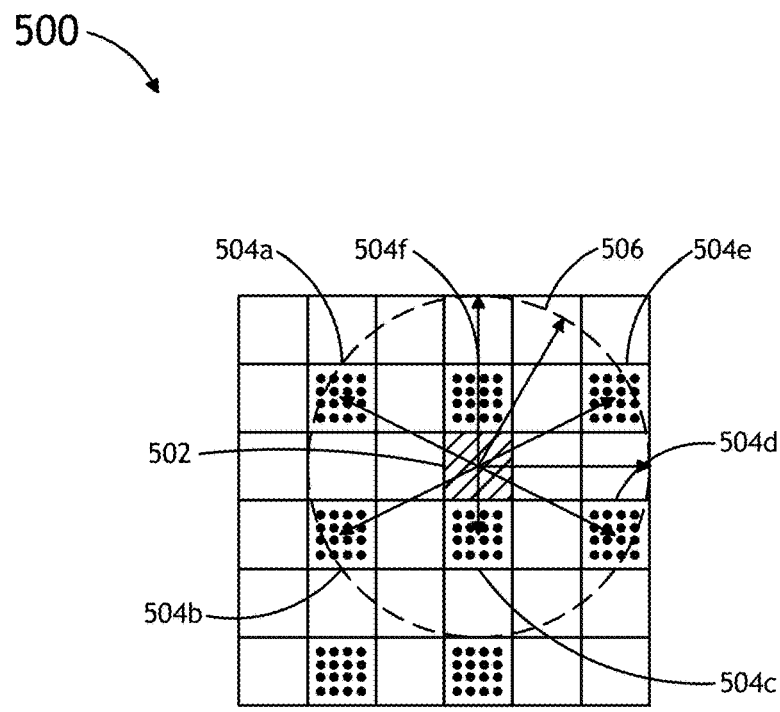
FIG. 5C illustrates a partial wafer sample set for generating one or more sample points for one or more unmeasured fields via proximity-based mathematical modeling, in accordance with an embodiment of this disclosure.
Figure 5D:
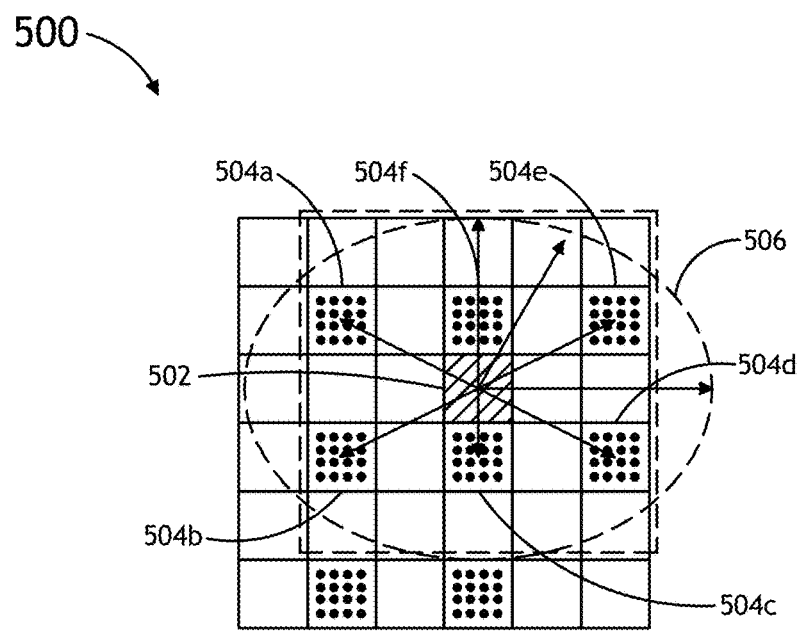
FIG. 5D illustrates a partial wafer sample set for generating one or more sample points for one or more unmeasured fields via proximity-based mathematical modeling, in accordance with an embodiment of this disclosure.

Looking now to FIG. 5B, the parameter values for the unmeasured field 502 may be estimated by averaging the parameter values of the measured fields 504$a$, 504$b$, . . . 504$f$ that are located within the specified zone 506. In some embodiments, the parameter values for the unmeasured field 502 are further base upon a weighted averaging of the parameter values of the measured fields 504, where the measured fields 504 are weighted according to their respective distances from the unmeasured field 502. The specified proximity zone 506 is not restricted to any particular shape or definition. For example, the boundaries of the proximity zone 506 may define a region including, but are not limited to, a rectangular, circular, or elliptical region, as shown in FIGS. 5B, 5C, and 5D, respectively.

Figure 6:
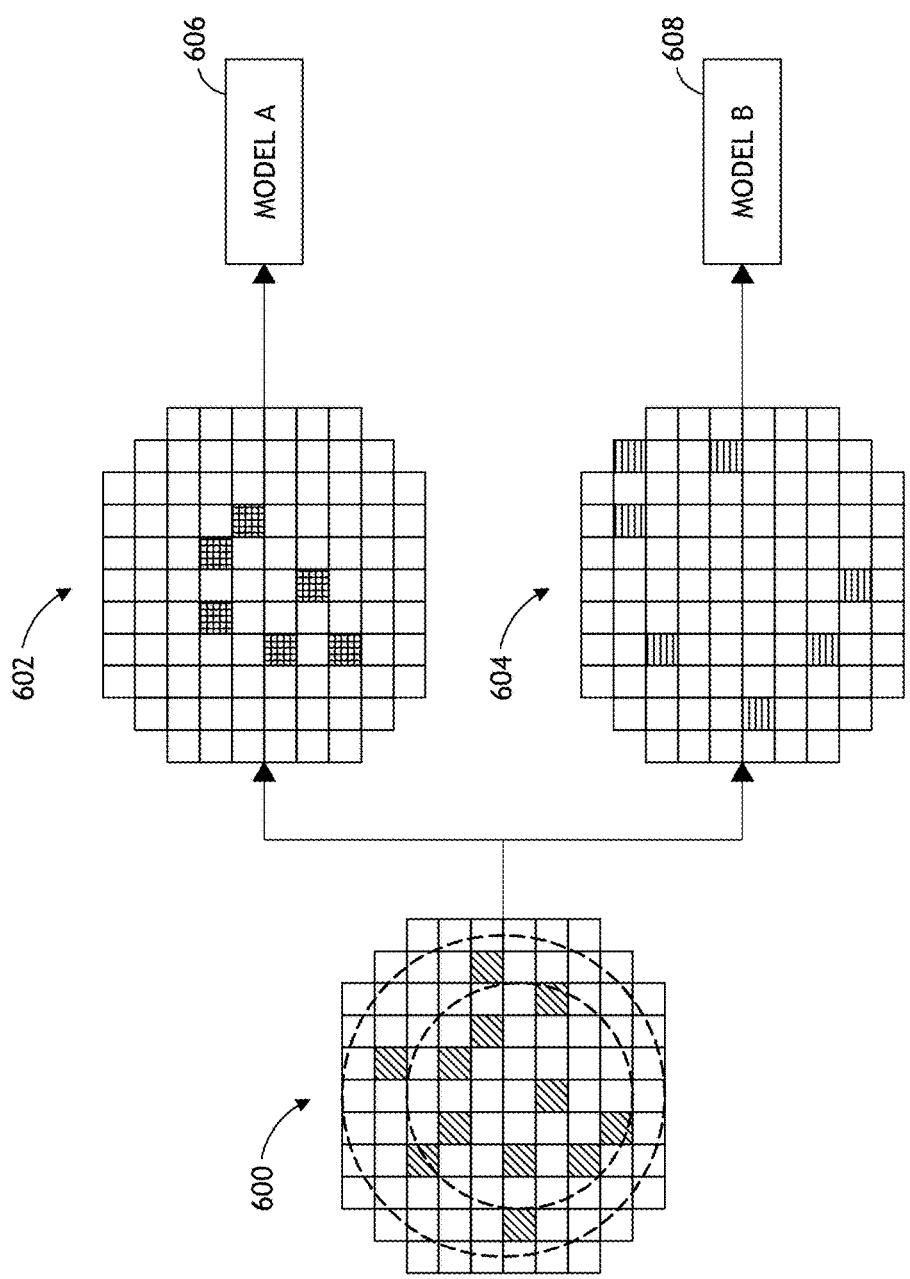
FIG. 6 illustrates a sample set being decomposed and fed into a plurality of mathematical models, in accordance with an embodiment of this disclosure.

In addition to the mathematical modeling techniques discussed above, several mathematical modeling techniques are known to the art, such as various extrapolation, interpolation, and statistical averaging techniques. In some embodiments, the measured parameter values are inputted to a mixture of mathematical models where, for example, at least a first mathematical model and a second mathematical model may be utilized to generate parameter values for a first group of unmeasured fields located in a first region of the wafer 102 and a second group of unmeasured fields located in a second region of the wafer 102, respectively. Further, the parameter values for the unmeasured fields or for at least one group or subset of the fields may be generated using two or more weighted models. As shown in FIG. 6, the measured parameter values of a sample set 600 may be used as inputs for a plurality of mathematical models, such as models 606 and 608, to generate estimated parameter values for some or all of the unmeasured fields (and for unmeasured points within the sampled fields).

In some embodiments, the measured sample set 600 is further decomposed into two or more subsets, such as subsets 602 and 604, where each subset may be associated with a respective one of the models used to generate the modeled parameter values. Because each of the models and/or each of the subsets associated with each of the models may be better-suited for characterization of process signature at a different regions of the wafer 102, the models and/or the sample subsets may be assigned different weights for estimating or modeling the parameter values of the fields located at different regions of the wafer 102. In some embodiments, for example, a first subset 602 of the sample set 600 includes measurements from fields located in a central region of the wafer 102 and a second subset 604 of the sample set 600 includes measurements from fields located in an outer region of the wafer 102 that is nearer to the edge. The parameter values of each of the subsets 602 and 604 may be used as inputs to respective models 606 and 608. For example, the measured parameter values of the subset 602 associated with a central region of the wafer 102 may be input to a first model 606 "MODEL A," and the measured parameter values of the subset 604 associated with an outer (edge) region of the wafer 102 may be input to a second model 608 "MODEL B." Those skilled in the art will appreciate that any number of models may be used. For example, some models may be focused on right/left, top/bottom regions, or a combination thereof. Some models may additionally or alternatively be based on the same sample set or subset, but rely on different mathematical modeling techniques.

Figures 7A, 7B:
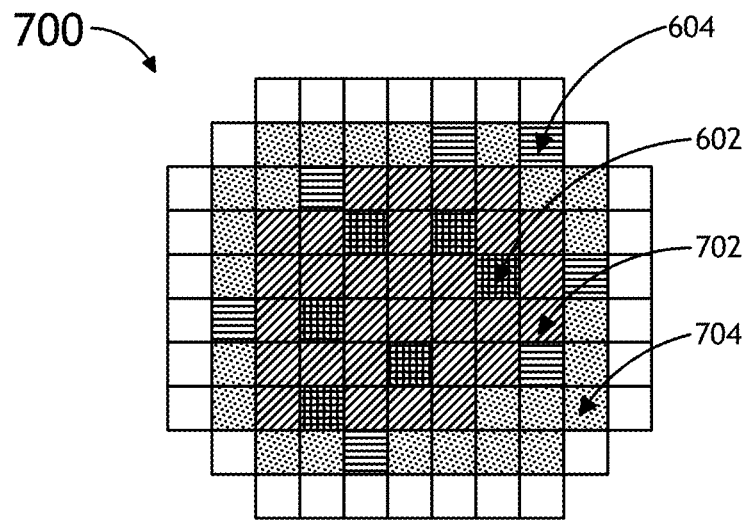
FIG. 7A illustrates groups of fields distinguished by the regions of a wafer in which they are located, in accordance with an embodiment of this disclosure.
FIG. 7B is a table showing exemplary weights assigned to a plurality of models, wherein the parameter values estimated for unmeasured fields or unmeasured points of a group of fields of the wafer are determined according to a respective weighting of the mathematical models, in accordance with an embodiment of this disclosure.

FIG. 7A shows an exemplary field-by-field mapping 700 where the wafer fields are distributed into a plurality of groups or regions (e.g. at least a first region 702 and a second region 704). In some embodiments, parameter values for unmeasured fields located within a central portion of the wafer 102, such as those in the first region 702, may be better approximated with polynomial modeling techniques and/or using parameter values of the subset 602 associated with the central region of the wafer 102; whereas, the parameter values for unmeasured fields located at or near the wafer edge, such as those in the second region 704, may be better approximated with zonal modeling techniques and/or using parameter values of the subset 604 associated with the outer region of the wafer 102. Accordingly, it may be advantageous to utilize a first mathematical model (e.g. "MODEL A") for a first group or subset of the fields located within the first region 702 and a second mathematical model (e.g. "MODEL B") for a second group or subset of the fields located within the second region 704. In some cases, it may also be beneficial to rely on a mixture of models, which may be weighted according to their perceived efficacy. For example, FIG. 7B includes a table illustrating an embodiment where the parameter values for fields in regions 702 and 704 are generated according to different weightings of the mathematical models, where the weightings may be user-specified, predetermined, randomly generated, based upon a mapping of the measured sample set, and/or based upon statistical analysis of previous measurements.

Looking again to FIGS. 2A and 2B, after the full field-by-field analysis set is generated for the wafer 102 using the measured and modeled parameter values, the method 200 proceeds to step 206 where one or more CPE correctables are determined for the process tool 112 using the full wafer sample set. In some embodiments, as shown in FIG. 2B, the method 200 further includes steps for determining one or more scanner baseline correctables for the process tool 112 to correct mechanical or optical drifts based upon measurements performed on a calibration (non-product) wafer. At step 208, one or more parameter values are measured from one or more measurement locations of the calibration wafer. At step 210, the sample set collected from the calibration wafer may then be utilized to determine the one or more scanner baseline correctables. At step 212, the one or more CPE correctables (determined in steps 202-206 with measured and estimated field parameters of a product) and the one or more scanner baseline correctables (determined in steps 208-210 using measurements from a calibration wafer) may be combined to provide a combined correctable input file for the process tool 112. In some embodiments, the process tool 112 may, therefore, be controlled with a single control loop that provides field-by-field updates on a run-to-run basis as well as scanner baseline correctables. Those skilled in the art will readily appreciate the reduction in cost and the improvement in control over process signature that is offered by the integrated control loop manifested by the system and method described herein.

Those having skill in the art will further appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. In some embodiments, various steps, functions, and/or operations are carried out by one or more of the following: electronic circuits, logic gates, field programmable gate arrays, multiplexers, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a carrier medium. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A method, comprising:
    measuring one or more parameter values at one or more measurement locations of each field of a first set of fields of a plurality of fields on a wafer with a metrology tool, wherein the first set of fields includes a fewer number of fields than the entire plurality of fields;
    estimating one or more parameter values for one or more locations of each field of a second set of fields of the plurality of fields on the wafer via a first extrapolation mathematical model applied to a first subset of fields of the second set of fields of the plurality of fields and a second extrapolation mathematical model applied to a second subset of fields of the second set of fields of the plurality of fields, wherein the first extrapolation mathematical model is separate from the second extrapolation mathematical model, wherein the first subset of fields includes a fewer number of fields than the entirety of the second set of fields, wherein the second set of fields includes a fewer number of fields than the entire plurality of fields, wherein the first set of fields and the second set of fields include one or more different fields;
    generating a first analysis map from the one or more parameter values measured at the one or more measurement locations of each field of the first set of fields of the plurality of fields on the wafer;
    generating a second analysis map from the one or more parameter values estimated for the one or more locations of each field of the second set of fields of the plurality of fields on the wafer;
    determining a plurality of correctables for a process tool based on the first analysis map and the second analysis map, wherein the one or more parameter values are estimated prior to the determining of the plurality of correctables, wherein the plurality of correctables includes at least one of one or more correctables for calibration of a semiconductor device production process or one or more correctables for calibration of the process tool; and
    providing one or more control signals based on the plurality of correctables to the process tool to control at least one of a feed forward loop or a feedback loop during calibration of the process tool,
    wherein the wafer is one of a first lot of wafers, wherein at least one of the feed forward loop or the feedback loop is configured to adjust the process tool during or prior to processing at least one wafer of a second lot of wafers.

2. The method of claim 1, wherein at least one of the first extrapolation mathematical model or the second extrapolation mathematical model comprises a polynomial extrapolation.

3. The method of claim 1, wherein at least one of the first extrapolation mathematical model or the second extrapolation mathematical model comprises a zonal extrapolation.

4. The method of claim 1, wherein the first extrapolation mathematical model has a first assigned weight and the second extrapolation mathematical model has a second assigned weight.

5. The method of claim 1, wherein the one or more parameter values measured at the one or more measurement locations of each field of a first subset of the first set of fields of the plurality of fields of the wafer are used as inputs for the first extrapolation mathematical model, and wherein the one or more parameter values measured at the one or more measurement locations of each field of a second subset of the first set of fields of the plurality of fields of the wafer are used as inputs for the second extrapolation mathematical model.

6. The method of claim 1, wherein the one or more parameter values for the one or more locations of the first subset of fields of the second set of fields of the plurality of fields on the wafer are generated according to a first weighting of the first and second extrapolation mathematical models, wherein the one or more parameter values for the one or more locations of each field of the second subset of fields of the second set of fields of the plurality of fields on the wafer are generated according to a second weighting of the first and second extrapolation mathematical models.

7. The method of claim 1, wherein the plurality of correctables comprises at least one optical adjustment for the process tool.

8. The method of claim 1, wherein the plurality of correctables comprises at least one mechanical adjustment for the process tool.

9. The method of claim 1, wherein the plurality of correctables comprises at least one of an APC run-to-run correction and a CPE field-by-field correction.

10. The method of claim 1, further comprising:
measuring one or more parameter values at one or more measurement locations of a calibration wafer, wherein the plurality of correctables for the process tool are further based upon the one or more parameter values measured at the one or more measurement locations of the calibration wafer.

11. The method of claim 10, wherein the plurality of correctables comprises at least one of an APC run-to-run correction, a CPE field-by-field correction, and a scanner baseline correction.

12. The method of claim 1, further comprising:
generating a combined analysis map from the first analysis map and the second analysis map, wherein the plurality of correctables are determined from the combined analysis map, wherein the first analysis map is a two-dimensional visual representation of the measured one or more parameter values, wherein the second analysis map is a two-dimensional visual representation of the one or more parameter values estimated via the at least one mathematical model, wherein the combined analysis map is a combined two-dimensional visual representation.

13. The method of claim 1, wherein the plurality of correctables includes one or more correctables for calibration of the semiconductor device production process and one or more correctables for calibration of the process tool.

14. A system comprising:
at least one metrology tool configured to measure one or more parameter values at one or more measurement locations of each field of a first set of fields of a plurality of fields on a wafer, wherein the first set of fields includes a fewer number of fields than the entire plurality of fields; and
at least one computing system configured to:
estimate one or more parameter values for one or more locations of each field of a second set of fields of the plurality of fields on the wafer via a first extrapolation mathematical model applied to a first subset of fields of the second set of fields of the plurality of fields and a second extrapolation mathematical model applied to a second subset of fields of the second set of fields of the plurality of fields, wherein the first extrapolation mathematical model is separate from the second extrapolation mathematical model, wherein the first subset of fields includes a fewer number of fields than the entirety of the second set of fields, wherein the second set of fields includes a fewer number of fields than the entire plurality of fields, wherein the first set of fields and the second set of fields include one or more different fields;
generate a first analysis map from the one or more parameter values measured at the one or more measurement locations of each field of the first set of fields of the plurality of fields on the wafer;
generate a second analysis map from the one or more parameter values estimated for the one or more locations of each field of the second set of fields of the plurality of fields on the wafer;
determine a plurality of correctables for a process tool based on the first analysis map and the second analysis map, wherein the one or more parameter values are estimated prior to the determining of the plurality of correctables, wherein the plurality of correctables includes at least one of one or more correctables for calibration of a semiconductor device production process or one or more correctables for calibration of the process tool; and
provide one or more control signals based on the plurality of correctables to the process tool to control at least one of a feed forward loop or a feedback loop during calibration of the process tool,
wherein the wafer is one of a first lot of wafers, wherein at least one of the feed forward loop or the feedback loop is configured to adjust the process tool during or prior to processing at least one wafer of a second lot of wafers.

15. The system of claim 14, wherein the first extrapolation mathematical model has a first assigned weight and the second extrapolation mathematical model has a second assigned weight.

16. The system of claim 14, wherein the at least one computing system is further configured to:
utilize the one or more parameter values measured at the one or more measurement locations of each field of a first subset of the first set of fields of the plurality of fields of the wafer as inputs for the first extrapolation mathematical model, and
utilize the one or more parameter values measured at the one or more measurement locations of each field of a second subset of the first set of fields of the plurality of fields of the wafer as inputs for the second extrapolation mathematical model.

17. The system of claim 14, wherein the at least one computing system is further configured to:
generate the one or more parameter values for the one or more locations of each field of the first subset of fields of the second set of fields of the plurality of fields on the wafer according to a first weighting of the first and second extrapolation mathematical models; and
generate the one or more parameter values for the one or more locations of each field of the second subset of fields of the second set of fields of the plurality of fields on the wafer according to a second weighting of the first and second extrapolation mathematical models.

18. The system of claim 14, wherein the at least one metrology tool is further configured to measure one or more parameter values at one or more measurement locations of a calibration wafer, wherein the plurality of correctables for the process tool are based on the one or more parameter values measured at the one or more measurement locations of the calibration wafer.

19. The system of claim 14, wherein the at least one computing system is further configured to:
generate a combined analysis map from the first analysis map and the second analysis map, wherein the plurality of correctables are from the combined analysis map, wherein the first analysis map is a two-dimensional visual representation of the measured one or more parameter values, wherein the second analysis map is a two-dimensional visual representation of the one or more parameter values estimated via the at least one mathematical model, wherein the combined analysis map is a combined two-dimensional visual representation.

20. A non-transitory carrier medium bearing an instruction set that is executable by at least one processor, the instruction set including instructions for the at least one processor to:
receive one or more parameter values measured at one or more measurement locations of each field of a first set of fields of a plurality of fields on a wafer from a metrology tool, wherein the first set of fields includes a fewer number of fields than the entire plurality of fields;
estimate one or more parameter values for one or more locations of each field of a second set of fields of the plurality of fields on the wafer via a first extrapolation mathematical model applied to a first subset of fields of the second set of fields of the plurality of fields and a second extrapolation mathematical model applied to a second subset of fields of the second set of fields of the plurality of fields, wherein the first extrapolation mathematical model is separate from the second extrapolation mathematical model, wherein the first subset of fields includes a fewer number of fields than the entirety of the second set of fields, wherein the second set of fields includes a fewer number of fields than the entire plurality of fields, wherein the first set of fields and the second set of fields include one or more different fields;
generate a first analysis map from the one or more parameter values measured at the one or more measurement locations of each field of the first set of fields of the plurality of fields on the wafer;
generate a second analysis map from the one or more parameter values estimated for the one or more locations of each field of the second set of fields of the plurality of fields on the wafer;
determine a plurality of correctables for a process tool based on the first analysis map and the second analysis map, wherein the one or more parameter values are estimated prior to the determining of the plurality of correctables, wherein the plurality of correctables includes at least one of one or more correctables for calibration of a semiconductor device production process or one or more correctables for calibration of the process tool; and
provide one or more control signals based on the plurality of correctables to the process tool to control at least one of a feed forward loop or a feedback loop during calibration of the process tool,
wherein the wafer is one of a first lot of wafers, wherein at least one of the feed forward loop or the feedback loop is configured to adjust the process tool during or prior to processing at least one wafer of a second lot of wafers.

21. The non-transitory carrier medium of claim 20, wherein the instruction set further includes instructions for the at least one processor to:
generate a combined analysis map from the first analysis map and the second analysis map, wherein the plurality of correctables are determined from the combined analysis map, wherein the first analysis map is a two-dimensional visual representation of the measured one or more parameter values, wherein the second analysis map is a two-dimensional visual representation of the one or more parameter values estimated via the at least one mathematical model, wherein the combined analysis map is a combined two-dimensional visual representation.

* * * * *